United States Patent [19]

Lightstone

[11] Patent Number: 4,637,126
[45] Date of Patent: Jan. 20, 1987

[54] METHOD FOR MAKING AN AVALANCHE PHOTODIODE

[75] Inventor: Alexander W. Lightstone, Quebec, Canada

[73] Assignee: RCA, Inc., Ste-Anne-de-Bellevue, Canada

[21] Appl. No.: 771,066

[22] Filed: Aug. 30, 1985

[51] Int. Cl.⁴ .......................................... H01L 21/302
[52] U.S. Cl. .......................................... 29/572; 29/580; 29/574; 29/576 B; 148/1.5; 148/DIG. 13; 357/30; 156/626
[58] Field of Search ............. 29/572, 580, 574, 576 B; 148/DIG. 13, 1.5; 357/30, 13, 20; 156/626, 648

[56] References Cited

U.S. PATENT DOCUMENTS

| | | | |
|---|---|---|---|
| 2,989,385 | 6/1961 | Gianola et al. | 29/576 B |
| 3,228,862 | 1/1966 | Vulcan | 156/648 |
| 4,383,267 | 5/1983 | Webb | 357/30 |
| 4,463,368 | 7/1984 | McIntyre | 357/30 |

OTHER PUBLICATIONS

S. M. Sze, Physics of Semiconductor Devices, 2nd Edition, (John Wiley & Sons, Inc., 1981).

Primary Examiner—Brian E. Hearn
Assistant Examiner—John T. Callahan
Attorney, Agent, or Firm—Birgit E. Morris; William J. Burke

[57] ABSTRACT

An avalanche photodiode includes a region of second conductivity type extending a distance into a substrate and a region of first conductivity type extending a further distance into the substrate of first conductivity type with a P-N junction therebetween. The invention is a method for fabricating an avalanche photodiode having a specified breakdown voltage. The method includes the step of measuring the concentration of the first type conductivity modifiers and removing a portion of the surface of the substrate prior to forming the region of second conductivity type. This method provides control of the concentration of the first type conductivity modifiers at the P-N junction and thereby controls the breakdown voltage.

7 Claims, 7 Drawing Figures

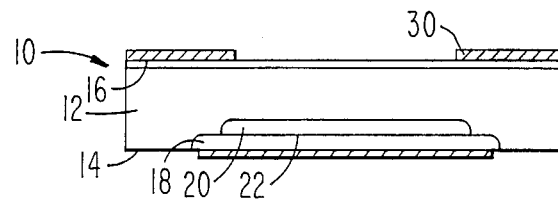
Fig. 1
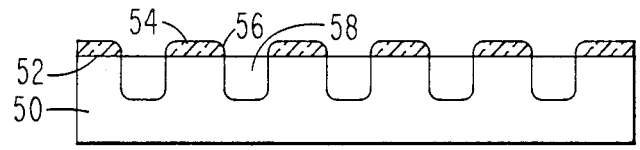
Fig. 2
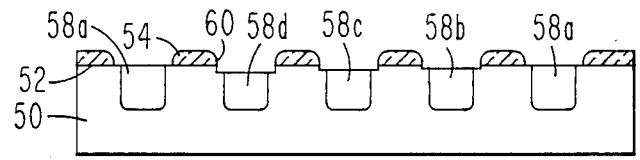
Fig. 3
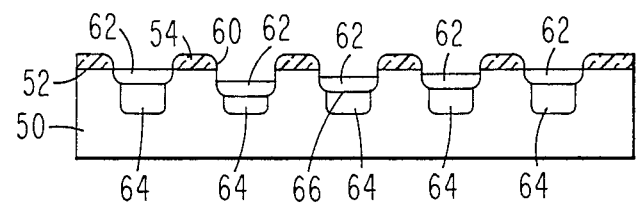
Fig. 4
Fig. 5
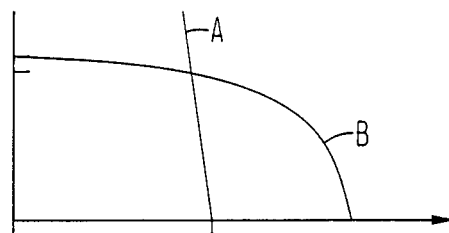
(a)
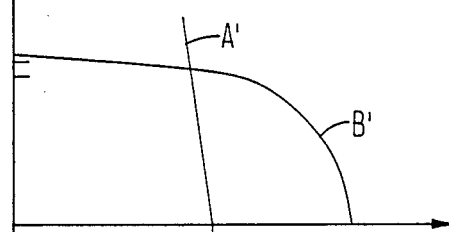
CONCENTRATION
(b)
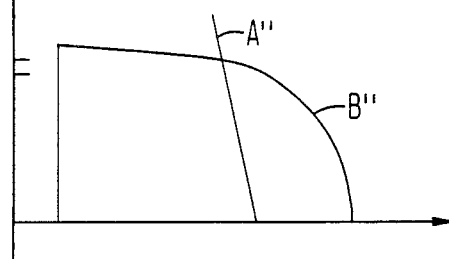
(c)

METHOD FOR MAKING AN AVALANCHE PHOTODIODE

The invention relates to a manufacturing process for avalanche photodiodes which increases the yield of photodiodes having the same operating parameters.

BACKGROUND OF THE INVENTION

An avalanche photodiode is a light detector which typically comprises a $\pi$-type conductivity substrate, such as silicon, having an N-type region extending into the substrate a distance from a first major surface thereof and a P-type region extending a further distance into the substance from the N-type region, forming a P-N junction therebetween. A P+-type contacting region extends a distance into the substrate from a second major surface thereof to provide for electrical contacting to the substrate. When a reverse bias voltage is applied to this photodiode the depletion region of the diode reaches from the P-N junction into he $\pi$-type region when the peak electric field at the P-N junction is about 5–10% less than that required to cause an avalanche breakdown. A further increase in the applied voltage causes the depletion region to extend towards the P+-type region, while the electric field throughout the diode increases relatively slowly.

Avalanche photodiodes, which are typically a few square millimeters in area, are fabricated in a silicon wafer containing potentially hundred of such diodes. In the structure described above the first manufacturing step is typically a boron ion implantation into defined regions of the wafer to form the P-type region. However, this boron ion implantation is limited by state of the art machinery such that one portion of the wafer may receive a greater areal dose than another portion. These fluctuations in areal dose may arise from nonuniformities in the ion beam pattern or from temporal variations in the ion source output. For a typical wafer thickness of about 0.18 millimeters, a diode with an implanted boron concentration about 2% higher than the average will have a breakdown voltage about 100 volts less than that of the average diode. Using presently available machinery only about half of the diodes from a wafer have a breakdown voltage in an acceptable range. Thus, it would be desirable to have a manufacturing method for avalanche photodiodes which compensated for this variation in the implanted dose so as to increase the yield of acceptable devices from a wafer.

SUMMARY OF THE INVENTION

The invention is a method for making an avalanche photodiode which includes the steps of embedding first type conductivity modifiers into a first surface of a substrate, measuring the local concentration of the first type conductivity modifiers and selectively removing portions of the first surface to obtain the desired first type conductivity modifier concentration profile prior to forming a second region of opposite conductivity type in the first surface.

BRIEF DESCRIPTION OF THE DRAWING

FIG. 1 is a cross-sectional view of an avalanche photodiode.

FIGS. 2–4 are cross-sectional views of a semiconductor wafer at different steps in the fabrication process for making avalanche photodiodes according to the invention.

FIG. 5(a) is a graphical illustration of the dopant profile for an acceptable device;

FIG. 5(b) is a graphical illustration of the dopant profile for a device having an excess concentration of second conductivity type modifiers; and FIG. 5(c) is a graphical illustration of the dopant profile of the device of FIG. 5(b) after treatment according to the principles of the invention.

DETAILED DESCRIPTION OF THE PREFERRED EMBODIMENTS

In FIG. 1 an avalanche photodiode 10 includes a substrate 12 of first conductivity type having first and second major surfaces 14 and 16, respectively. A region 18 of second conductivity type extends a distance into the substrate 12 from the surface 14. A region 20 of first conductivity type extends a further distance into the substrate 12 from the region of second conductivity type 18, thereby forming a P-N junction at the interface 22 between the regions 18 and 20. A contacting region 24 of first conductivity type extends a distance into the substrate from the second major surface 16. In general, the concentration of first type conductivity modifiers in the contacting region 24 is greater than that in the region 20, whose conductivity modifier concentration is, in turn, greater than that in the substrate 12. A first electrical contact 20 overlies a portion of the surface 16 to provide electrical contact to the contacting region 24. A second electrical contact 32 overlies the major surface 14 to provide electrical contact to the region 18. The first and second electrical contacts 30 and 32, respectively, provide means for electrically contacting the avalanche photodiode 10.

The substrate 12 typically has $\pi$-type conductivity with a resistivity between about 500 and 10,000 ohm-cm and preferably about 3,000 ohm-cm. The region 18 typically has N-type conductivity and extends a distance of about 10 micrometers ($\mu$m) into the substrate 12 from the surface 14 and extends laterally over a portion of the substrate surface 14. This region is typically formed by a drive-in diffusion of phosphorus from a phosphorus-doped oxide overlying a portion of the surface 14. The region 20 typically has P-type conductivity and extends a further distance, typically about 15 $\mu$m, into the substrate 12 from the interface 22 with the region 18. The region 20 is typically formed by ion implantation of boron followed by a drive-in diffusion prior to the formation of the second conductivity type region 18. The contacting region 24 typically has P+-type conductivity and extends between about 0.5 and about 1 $\mu$m into the substrate from the surface 16. This region is typically formed by diffusion from a boron nitride source for about 30 minutes at 1000° C. The first and second electrical contacts 30 and 32, respectively, are formed of metals which will provide ohmic contact to the adjacent regions of the semiconductor substrate. While the avalanche photodiode has been described in terms of particular conductivity types for the particular regions, it is to be understood that the opposite conductivity types may be used so long as the relative conductivity types of the different regions are maintained.

In FIGS. 2–4 corresponding elements have the same numerical identification.

Generally a plurality of avalanche photodiodes are fabricated in a wafer using the following process sequence. As shown in FIG. 2, a silicon wafer 50 about 180 μm thick has on its surface 52 a mask layer 54 having a plurality of openings 56 therethrough which correspond to the locations of the avalanche photodiodes to be fabricated in the wafer. A plurality of regions 58 of first conductivity type are formed in the wafer 50 by ion implantation through the openings 56 in the mask 54 followed by a diffusion step. The conductivity modifier is typically boron implanted at 100 Kev at an areal dose of about $10^{13}/cm^2$. The diffusion step then follows such that the regions 58 extend into the substrte a distance between about 15 and 40 μm from the surface 52.

If the areal dose of the boron fluctuates across the surface 52 then the corresponding local boron concentration in the diffused regions 58 will vary from device to device in the wafer producing, in turn, a variation in the breakdown voltage from device to device. If the areal dose is too high, then the dopant concentration of a first conductivity type region 58 at the P-N junction will be higher and thus the breakdown voltage will be lower. For example, if the boron dose is 2% higher than the desired dose, the breakdown voltage will be about 100 volts lower than the desired voltage. Such devices are then out of specification during post-manufacturing tests.

The invention is a method for compensating for the fluctuations in the areal dose of the first type conductivity modifiers by measuring the dopant concentration after the diffusion step and then compensating for any local excess dose by locally removing a portion of the material from the surface 52 prior to the formation of the second conductivity type region. The purpose of this material removal step is not just to remove a quantity of the first type conductivity modifier but to increase the depth to which the second type conductivity modifiers are diffused so that the first conductivity type modifier concentration at the P-N junction is correct.

The step of measuring the local dopant concentration in the wafer is preferably carried out after the introduction and diffusion of the boron to form the first type conductivity region 58 of FIG. 2. The total boron dose should be known to an accuracy of better than one percent and may be measured by any one of several well-known techniques including a C-V plot or a breakdown voltage measurement. The C-V plot requires that the grown oxide thickness and the contact area be known very accurately. For example, for an overall measurement accuracy of one percent the contact area must be known to an accuracy better than one-half percent. Alternatively, variations in the concentration of the first type conductivity modifiers can be inferred from the variation in the breakdown voltage as shown, for example, by Sze in *Physics of Semiconductor Devices*, 2nd Edition (John Wiley & Sons, Inc. 1981) in FIG. 28 at p. 102. From this Figure, one can estimate that a 1% change in the dopant concentration produces a 1% change in the breakdown voltage. For an areal dose of $10^{13}/cm^2$, diffused into the silicon wafer about 20 μm, the concentration is about ;b $5 \times 10^{15}/cm^3$. The breakdown voltage will be about 95 volts. The breakdown voltage may be measured by using a very shallow phosphorus doped region if the first conductivity type modifier is boron. This phosphorus doped region would later be etched off. Using this technique a change in the breakdown voltage of less than 1% can be easily measured.

In general, a fraction of the regions 58 of first conductivity type do not require material removal to fall within the device specifications and other fractions will require the removal of different amounts of material from the surface to provide useful devices. Those regions 58 which do not require removal of any material are masked and the remaining regions etched to remove an amount of material corresponding to the smallest amount required to bring a second fraction of the regions 58 within the specifications. This fraction of the regions 58 is then masked and a further amount of material is removed from the remaining exposed regions 58 corresponding to that amount required to bring a third fraction of the regions 58 within specification and so on. In FIG. 3 the result of the etching processes to remove a portion of the material from the wafer surface corresponding to the measurement of the first conductivity type modifier dose is illustrated. The openings 60 in the insulating layer 54 are, preferably, first enlarged in width compared to the openings 58 of FIG. 2 to correspond to the desired width of the sound conductivity type regions subsequently formed. The regions designated as 58a illustrate regions for which no material removal is required. Regions 58b, 58c, and 58d illustrate regions having successively greater amounts of material removed, respectively.

In FIG. 4 a wafer is shown after diffusion of the second conductivity type modifiers into the openings 60. The regions 62 of second conductivity type extend a distance into the substrate from the surface thereof exposed in the openings 60. The regions 64 of first conductivity type extend a further distance into the body from the regions 62 forming P-N junctions 66 at the interface between the regions 62 and 64. The regions 64 are shown to have different depths because of the differing extent of material removal in the different openings 60. The regions 62 each have the same depth since for these regions this dimension depends only upon the diffusion process.

In FIG. 5(a) the dopant profiles A and B for the second and first conductivity type modifiers, respectively, are plotted as a function of depth from the substrate surface, indicated by the ordinate axis, for an acceptable device. The P-N junction occurs at the point where the profiles A and B intersect. The dopant concentration at which the junction occurs is indicated by the mark on the ordinate axis. In FIG. 5(b) the dopant profile B' for the first type conductivity modifier is higher than that of FIG. 5(a) so that the P-N junction occurs at the dopant concentration indicated by the higher mark on the ordinate axis. By way of comparison, the lower mark corresponds to the concentration in FIG. 5(a). In FIG. 5(c) the dopant profile B'' is the same as the profile B' in FIG. 5(b). The profiles are shown as starting at a depth below the original surface corresponding to the amount of material removed from the surface. The second conductivity type profile A'' is shown as shifted to a greater depth relative to the ordinate axis but is at the same depth relative to the surface after material removal. The dopant concentration at the P-N junction now occurs at the concentration indicated by the lower mark on the ordinate axis as in FIG. 5(a).

The substrate surface may be etched by any well-known technique, such as ion milling, reactive ion or wet chemical etching, for which the material removal rate can be accurately controlled. For example, I have used an etchant solution comprising $97HNO_3:3HF$ to remove silicon at a rate of about 1.75 μm/min. with the actual rate being sensitive, among other things, to the degree of agitation of the solution. Black waxes are suitable masking materials for use with this etchant solution. Dilution of this etchant solution will reduce the etching rate from that given here.

While the invention has been described in terms of adjusting the breakdown voltage of an avalanche photodiode as a whole by uniforming etching of the surface, it is clear that the invention is equally applicable for adjusting the breakdown voltage across a single device by selective etching of portions of the surface. For example, in a large area photodiode variations in the first type conductivity modifier concentration across the device may be compensated for by the use of selective etching techniques. In other cases, the breakdown voltage can be tailored to provide a particular gain profile across the device using the procedure described herein.

I claim:

1. A method of making an avalanche photodiode comprising the steps of:
    embedding first type conductivity modifiers into a semiconductor body have a first conductivity type through a portion of a surface thereof wherein the concentration of first type conductivity modifiers is greater than the concentration of first type conductivity modifiers originally in said body;
    measuring the concentration of said embedded first type conductivity modifiers;
    removing material from said portion of said surface corresponding to the variation in the measured local concentration of said embedded first type conductivity modifiers; and
    embedding second type conductivity modifiers having the opposite conductivity type to said first type conductivity modifiers into said body through said portion of said first surface in a concentration sufficient to convert a region of said body adjacent to said portion of said surface to said second conductivity type.

2. The method of claim 1 wherein said first type conductivity modifiers are diffused a distance into said body prior to the step of measuring the concentration of said first type conductivity modifiers.

3. The method of claim 2 wherein said portion of said surface adjacent the region containing said first type conductivity modifiers is uniformly etched to remove material from said body.

4. The method of claim 2 wherein the step of embedding said first type conductivity modifiers comprises ion implanting said first type conductivity modifiers into said body.

5. The method of claim 4 wherein the body is $\pi$-type conductivity silicon and the embedded first type conductivity modifier is boron.

6. The method of claim 2 wherein said portion of said surface adjacent the region containing said first type conductivity modifiers is selectively etched to remove material from said body corresponding to the variation in first type conductivity modifier concentration.

7. A method of making an avalanche photodiode comprising the steps of:
    embedding conductivity modifiers of a first conductivity type into a plurality of spaced apart regions of a wafer of semiconductor material, said regions extending a distance into said wafer from a first surface thereof, wherein the concentration of embedded first type conductivity modifiers is greater than the concentration of first type conductivity modifiers originally in said body;
    measuring the concentration of said embedded conductivity modifiers in each of said regions;
    masking said first surface adjacent a first fraction of said regions having a measured concentration less than a particular value, thereby forming first masked regions;
    selectively removing material from said first surface adjacent the unmasked regions; and
    embedding second type conductivity modifiers having the opposite conductivity type to said first conductivity type modifiers into each of said plurality of regions sufficient to convert a portion thereof adjacent said first surface to second conductivity type.

* * * * *